United States Patent
Long et al.

(10) Patent No.: US 9,063,626 B2
(45) Date of Patent: Jun. 23, 2015

(54) TOUCH RECOGNITION METHOD, TOUCH KEY STRUCTURE AND TOUCH DEVICE

(75) Inventors: Tao Long, Zhenjiang (CN); Zhengdong Liu, Zhenjiang (CN); Jiang Long, Zhenjiang (CN)

(73) Assignee: Jiangsu Huitong Group Co., Ltd, Zhenjiang, Jiangsu (CN)

( * ) Notice: Subject to any disclaimer, the term of this patent is extended or adjusted under 35 U.S.C. 154(b) by 101 days.

(21) Appl. No.: 13/877,051

(22) PCT Filed: Dec. 1, 2010

(86) PCT No.: PCT/CN2010/079311
§ 371 (c)(1),
(2), (4) Date: Mar. 29, 2013

(87) PCT Pub. No.: WO2012/040974
PCT Pub. Date: Apr. 5, 2012

(65) Prior Publication Data
US 2013/0222341 A1     Aug. 29, 2013

(30) Foreign Application Priority Data

Sep. 30, 2010   (CN) .......................... 2010 1 0515098

(51) Int. Cl.
| | | |
|---|---|---|
| G06F 3/044 | (2006.01) | |
| H03K 17/96 | (2006.01) | |
| G06F 3/041 | (2006.01) | |

(52) U.S. Cl.
CPC .............. G06F 3/044 (2013.01); G06F 3/0416 (2013.01); H03K 17/9622 (2013.01); H03K 2217/960755 (2013.01)

(58) Field of Classification Search
CPC .............. H03K 17/962; H03K 17/955; H03K 17/9622; H03K 2217/960725; H03K 2217/960755; G06F 3/044; G06F 3/0416
USPC ................. 345/173, 174; 178/18.06
See application file for complete search history.

(56) References Cited

U.S. PATENT DOCUMENTS 8,552,994 B2 * 10/2013 Simmons ...................... 345/173
2006/0294523 A1    12/2006 Beard et al.
(Continued)

FOREIGN PATENT DOCUMENTS

| CN | 2834045 Y | 11/2006 |
|---|---|---|
| CN | 101207377 A | 6/2008 |

(Continued)

OTHER PUBLICATIONS

Japanese Office Action dated Feb. 25, 2014 from corresponding Japanese Application 2013-530525.
(Continued)

*Primary Examiner* — Allison Johnson
(74) *Attorney, Agent, or Firm* — Wolf, Greenfield & Sacks, P.C.

(57) ABSTRACT

A touch recognition method, a touch key structure and a touch device are provided. The touch recognition method includes when the touch key structure is faced to touching or near touching, supplementing charges to a charge accumulation area corresponding to each key in the touch key structure until the charge amount in the charge accumulation area corresponding to each key reaches a balance; calculating the charge variation amount in each charge accumulation area when the touch key structure is faced to touching according to the charge supplement amount in the charge accumulation area corresponding to each key, and calculating the ratio of the charge variation amount to the charge balance amount in each charge accumulation area; recognizing the key corresponding to the charge accumulation area which has the largest charge variation amount and the largest ratio of the charge variation amount to the charge balance amount as the touched key.

6 Claims, 2 Drawing Sheets

(56) References Cited

U.S. PATENT DOCUMENTS

| | | | |
|---|---|---|---|
| 2010/0291973 A1* | 11/2010 | Nakahara et al. | 345/174 |
| 2010/0321331 A1* | 12/2010 | Oda et al. | 345/174 |
| 2011/0001491 A1* | 1/2011 | Huang et al. | 324/658 |
| 2012/0043970 A1* | 2/2012 | Olson | 324/601 |

FOREIGN PATENT DOCUMENTS

| | | | | |
|---|---|---|---|---|
| CN | 101359907 A | 2/2009 | | |
| CN | 101414819 A | 4/2009 | | |
| EP | 2 133 776 A1 | 12/2009 | | |
| JP | 07114866 A | 5/1995 | | |
| JP | 2002-528711 A | 9/2002 | | |
| JP | 2004-038919 A | 2/2004 | | |
| JP | 2005-149531 A | 6/2005 | | |
| JP | 2005-190950 A | 7/2005 | | |
| JP | 2007-157107 A | 6/2007 | | |
| JP | 2007-207531 A | 8/2007 | | |
| JP | 2007-208682 A | 8/2007 | | |
| JP | 2008-547107 A | 12/2008 | | |
| JP | 2009-037373 A | 2/2009 | | |
| JP | 2009-505209 A | 2/2009 | | |
| JP | 2009-535742 A | 10/2009 | | |
| JP | 2010-044470 A | 2/2010 | | |
| WO | WO 2008123546 A1 * | 10/2008 | | G06F 3/041 |
| WO | WO 2010081069 A1 | 7/2010 | | |

OTHER PUBLICATIONS

International Search Report dated Jul. 7, 2011 from corresponding International Application No. PCT/CN2010/079311.

Extended European Search Report dated Dec. 11, 2014 from corresponding European Application No. 10857737.0.

* cited by examiner

TOUCH RECOGNITION METHOD, TOUCH KEY STRUCTURE AND TOUCH DEVICE

CROSS-REFERENCE TO RELATED APPLICATIONS

This application is a Section 371 National Stage Application of international Application No. PCT/CN2010/079311, claims priority to Chinese patent application No. 201010515098.6, filed on Sep. 30, 2010, and entitled "TOUCH RECOGNITION METHOD, TOUCH KEY STRUCTURE AND TOUCH DEVICE", and the entire disclosure of which is incorporated herein by reference.

FIELD OF THE DISCLOSURE

The present disclosure generally relates to touch sensing technology, and more particularly, to a touch recognition method, a touch key structure and a touch device.

BACKGROUND OF THE DISCLOSURE

Touch screen is a touch sensing input device, which is widely used in cell phone, television and other media. According to touch sensing theories, touch screens can be divided into resistive touch screens, capacitive touch screens and so on. Since a resistive touch screen has low cost and is easily manufactured and controlled, it has been popular for many years. Recently, a capacitive touch screen, which has high light transmittance and extended life, and is anti abrasive and resistant to temperature variation and humidity of environment, and has the multi-point touch function, has received much attention in the industry.

To ensure a capacitive touch screen works efficiently, a transparent capacitive sensing array is desired. When a body or a special touch device, e.g., a stylus, approaches a capacitor induction electrode, capacitance detected by a sensing control circuit may be changed. According to capacitance variation in a touch region, touch situation in the touch region by the body or the special touch device can be recognized. According to formation methods of capacitors, conventional touch screens can be divided into self capacitive touch screens and mutual capacitive touch screens. For a self capacitive touch screen, variation of capacitance formed between a sense electrode and an alternating current ground or between a sense electrode and a direct current level electrode is taken as a touch sensing signal; for a mutual capacitive touch screen, variation of capacitance formed between two sense electrodes is taken as a touch sensing signal. In other conventional methods, touch situation can be recognized based on variation of charge amount in a touch region corresponding to the variation of capacitance.

However, for a capacitive touch screen, touch recognition based on detection of variation of charge amount can be easily influenced by using environment and touch manner of the touch screen. For example, when a device which can generate electric radiation (e.g., a cell phone or a hairdryer) is on operation near the touch screen, the charge amount on the surface of the touch screen will change abnormally. In this situation, if a conventional method is applied in touch recognition, a false recognition result may be obtained and even a misoperation may be caused. For another example, if the touch screen is touched by a finger with a slight strength and no effective touch contact is formed, a false recognition may be caused as well.

Therefore, a new technology which can perform touch recognition more accurately is desired.

SUMMARY

Embodiments of the present disclosure provide a touch recognition method, a touch key structure and a touch device to improve accuracy of touch recognition.

In an embodiment, a touch recognition method may include steps of:
  when a touch key structure is being touched or almost being touched, supplementing charges to charge accumulation regions corresponding to each key in the touch key structure until charge amounts in the charge accumulation regions corresponding to each key reach stability;
  calculating charge variation in each charge accumulation region when the touch key structure is being touched according to charge supplement amounts in the charge accumulation regions corresponding to each key and calculating the ratio of the charge variation to a charge balance amount in each charge accumulation region; and
  recognizing the key corresponding to the charge accumulation region which has the largest charge variation and the largest ratio of the charge variation to the charge balance amount as a touched key.

The touch key structure may include:
  an insulating touch panel which has a plurality of keys; and
  a detection plate which has a plurality of electrodes corresponding to each of the plurality of keys and is insulating and isolated from the insulating touch panel.

After the plurality of electrodes are charged, a plurality of source electric fields are generated respectively and charge accumulation regions are formed on surfaces of the plurality of electrodes. Each of the source fields penetrates a portion of the insulating touch panel corresponding to each of the plurality of keys to generate polarizing electric fields which spread out from a surface of each of the plurality of keys. And the charge accumulation regions corresponding to each of the plurality of electrodes are accumulated to be charge-balanced.

In an embodiment, a touch key structure may include:
  an insulating touch panel which has a plurality of keys; and
  a detection plate which has a plurality of electrodes corresponding to each of the plurality of keys and is insulating and isolated from the insulating touch panel.

After the plurality of electrodes are charged, a plurality of source electric fields are generated respectively and charge accumulation regions are formed on surfaces of the plurality of electrodes. Each of the source fields penetrates a portion of the insulating touch panel corresponding to each of the plurality of keys to generate polarizing electric fields which spread out from a surface of each of the plurality of keys. And the charge accumulation regions corresponding to each of the plurality of electrodes are accumulated to be charge-balanced.

In an embodiment, a touch device may include the touch key structure and a controller. The controller, connected with the plurality of electrodes on the detection plate, is configured to charge the plurality of electrodes, recognize a touch action by detecting charge variation of each of the plurality of electrodes to obtain a recognition result, and generate and output a recognition control signal according to the recognition result. Recognizing a touch action by detecting charge variation of each of the plurality of electrodes may include:

when a touch key structure is being touched or almost being touched, supplementing charges to charge accumulation regions corresponding to each key in the touch key structure until charge amounts in the charge accumulation regions corresponding to each key reach stability;

calculating charge variation in each charge accumulation region when the touch key structure is being touched according to charge supplement amounts in the charge accumulation regions corresponding to each key and calculating the ratio of the charge variation to a charge balance amount in each charge accumulation region; and recognizing the key corresponding to the charge accumulation region which has the largest charge variation and the largest ratio of the charge variation to the charge balance amount as a touched key.

Compared with the conventional technologies, the present disclosure has following advantages. Electric fields generated after electrode charging may penetrate an insulating touch panel to generate polarizing electric fields. When there is a touch action, the polarizing electric fields may be influenced and charge amounts in charge accumulation regions may be changed. Charge variation (charge amount absorbed by a finger in the polarizing electric fields) and the ratio of the charge variation to a charge balance amount are taken as a standard for touch recognition. In view of the above, more accurate touch recognition of a touch action is achieved.

Furthermore, with a touch key structure, when performing a touch action, it is unnecessary to touch an actual charged structure (electrode). Therefore, an air touch key is realized and a new touch recognition method is provided.

Furthermore, because of the air touch key, when performing a touch action, it is unnecessary for an operator to contact a touch panel, thereby effectively avoiding a false recognition.

DETAILED DESCRIPTION OF THE DISCLOSURE

To improve a capacitance touch screen and a touch recognition method, an air touch key is provided. By forming a special touch key structure, when performing a touch action, it is unnecessary for an operator to touch an actual charged structure. Accordingly, a power-on method and a touch recognition method are provided based on the touch key structure, thereby more accurate touch recognition may be realized.

In order to clarify the objects, characteristics and advantages of the disclosure, embodiments of present disclosure will be described in detail in conjunction with accompanying drawings.

Figure 1:
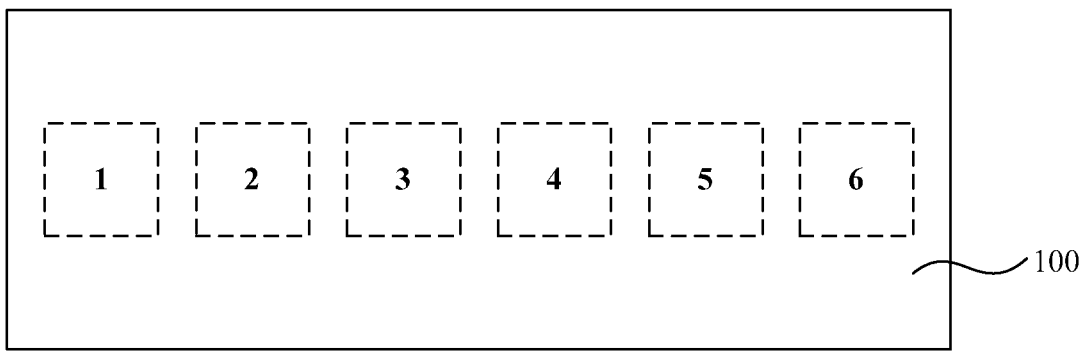
FIG. 1 schematically illustrates a vertical view of a touch key structure according to one embodiment of the present disclosure.
Figure 2:
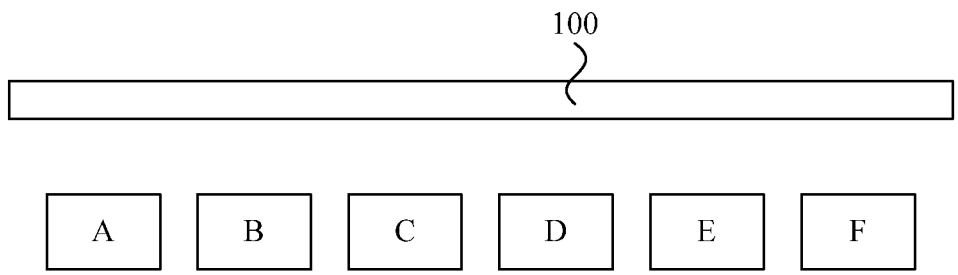
FIG. 2 schematically illustrates a sectional view of the touch key structure shown in FIG. 1 according to one embodiment of the present disclosure.

As shown in FIG. 1 and FIG. 2, in an embodiment, a touch key structure may include:

an insulating touch panel 100 which has a plurality of keys 1 to 6; and a detection plate which has a plurality of electrodes A to F corresponding to the plurality of keys 1 to 6 and is insulating and isolated from the insulating touch panel 100.

After the plurality of electrodes are charged, a plurality of source electric fields are generated respectively and charge accumulation regions are formed on surfaces of the plurality of electrodes. Each of the source fields penetrates a portion of the insulating touch panel corresponding to each of the plurality of keys to generate a polarizing electric field which spreads out from a surface of each of the plurality of keys. And the charge accumulation regions corresponding to each of the plurality of electrodes are accumulated to be charge-balanced.

The charge accumulation regions corresponding to each of the plurality of electrodes being accumulated to be charge-balanced may include: when charging each of the plurality of electrodes, charges begin to be accumulated in each charge accumulation region; and when no more charges can be accumulated in each charge accumulation region and discharging is to be performed, charges in the charge accumulation regions corresponding to each of the plurality of electrodes is balanced.

In one embodiment, the insulating touch panel 100 may be made of glass or other known insulating materials.

In one embodiment, the plurality of electrodes may be made of copper foil or other known conductive materials.

It should be noted, the number of keys on the insulating touch panel 100 may be 6 but not limited thereto. The number and function of keys may be set according to touch functions desired in practice. In some embodiments, the number of keys on the insulating touch panel 100 may be 8, 20 or more.

In view of the above description of the touch key structure, when touching a touch screen with the touch key structure, a finger does not need to contact with a charged electrode directly. Instead, by contacting with the insulating touch panel 100 which is not connected with the electrode or only approaching the insulating touch panel 100 but not contacting with it, charge amounts in the charge accumulation regions can be changed.

The reason for the above situation can be considered as follows. When each electrode generates a source electric field respectively after being charged, each source electric field will penetrate a portion of the insulating touch panel 100 within a range of the source electric field. Due to the penetration, the insulating touch panel 100 is polarized and polarizing electric fields are generated. By superimposing the polarizing electric fields on the corresponding source electric fields, an actual electric field is obtained. When a finger enters the polarizing electric field, the distribution of the actual electric field may be changed, which causes charge transfer in the charge accumulation regions. As a result, charge amounts in the charge accumulation regions may be changed.

It can be seen from the above, once charge amount happens in a charge accumulation region of an electrode is changed significantly, a key corresponding to the electrode can be considered as having been touched. Therefore, the variation in charge amount may be obtained through charge supplement to the charge accumulation regions and the largest variation in charge amount may be determined to have a touch action there. When a key is touched by a finger of a person, not only a polarizing electric field corresponding to the touched region is influenced, a polarizing electric field corresponding to an adjacent key may also be affected by other parts of the person (such as other fingers or palms). Therefore, the charge amount in a charge accumulation region of an electrode corresponding to the adjacent key may be changed. However, the charge amount is changed more slowly and the variation in charge amount is less than that in the touched region. As a result, based on the largest charge variation in conjunction with the ratio of charge variation to a charge balance amount, accurate touch recognition can be realized.

Accordingly, in an embodiment, a touch device may include: the touch key structure described above and a controller. The controller, connected with the plurality of electrodes on the detection plate, is configured to charge the plurality of electrodes, recognize a touch action by detecting charge variation of each of the plurality of electrodes to obtain a recognition result, and generate and output a recognition control signal according to the recognition result. Recognizing a touch action by detecting charge variation of each of the plurality of electrodes may include:

when a touch key structure is being touched or almost being touched, supplementing charges to charge accumulation regions corresponding to each key in the touch key structure until charge amounts in the charge accumulation regions corresponding to each key reach stability;

calculating charge variation in each charge accumulation region when the touch key structure is being touched according to charge supplement amounts in the charge accumulation regions corresponding to each key and calculating the ratio of the charge variation to a charge balance amount in each charge accumulation region; and recognizing the key corresponding to the charge accumulation region which has the largest charge variation and the largest ratio of the charge variation to the charge balance amount as a touched key.

The controller may include: a plurality of charging units, a memory unit, a trigger unit, a recognition and analysis unit and an output unit.

The plurality of charging units are connected with a plurality of electrodes in a touch key structure respectively and correspondingly, and are configured to charge the plurality of electrodes and supplement charges to a charge accumulation region corresponding to an electrode when the charge amount in the charge accumulation region is changed.

The memory unit is configured to store a charge balance amount of charge accumulation regions of the plurality of electrodes.

The trigger unit is configured to detect work status of the plurality of charging units. When a charging unit is detected in the act of supplementing charges, the trigger unit may trigger the recognition and analysis unit to work and send charge supplement information of the plurality of charging units to the recognition and analysis unit.

The recognition and analysis unit is configured to calculate charge variation in each charge accumulation region when the touch key structure is being touched based on charge supplement amounts in charge accumulation regions corresponding to each key, calculate the ratio of the charge variation to a charge balance amount in each charge accumulation region, recognize the key corresponding to the charge accumulation region which has the largest charge variation and the largest ratio of the charge variation to the charge balance amount as a touched key, and send recognition information to the output unit.

The output unit is configured to generate and output a recognition control signal based on the recognition information.

One of the plurality of charging units may include a clock generating circuit and a charging circuit.

The clock generating circuit is configured to generate sampling pulses to control the charging circuit to operate.

The charging circuit includes an analog electronic switch and a charging capacitor controlled by the analog electronic switch. The charging capacitor is connected with a corresponding electrode and the analog electronic switch is controlled by the sampling pulses.

Figure 3:
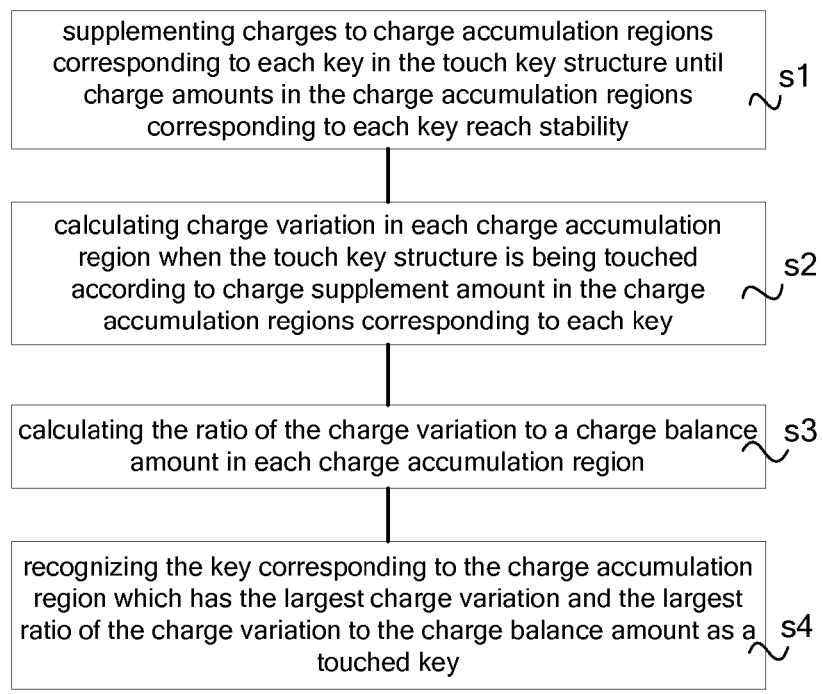
FIG. 3 schematically illustrates a touch recognition method according to one embodiment of the present disclosure.

Referring to FIG. 3, in an embodiment, a touch recognition method may include steps S1, S2, S3 and S4.

Step S1, when a touch key structure is being touched or almost being touched, supplementing charges to charge accumulation regions corresponding to each key in the touch key structure until charge amounts in the charge accumulation regions corresponding to each key reach stability;

Step S2, calculating charge variation in each charge accumulation region when the touch key structure is being touched according to charge supplement amounts in the charge accumulation regions corresponding to each key;

Step S3, calculating the ratio of the charge variation to a charge balance amount in each charge accumulation region; and Step S4, recognizing the key corresponding to the charge accumulation region which has the largest charge variation and the largest ratio of the charge variation to the charge balance amount as a touched key.

In one embodiment, some initialization processes may be performed before the above touch recognition process. The initialization processes include: detecting background environmental signals, shielding signals whose frequencies are beyond a range from a first frequency (80 KHZ in the embodiment) to a second frequency (120 KHZ in the embodiment) and generating a trigger signal after a signal whose frequency is between the first frequency and the second frequency is detected. The trigger signal is configured to trigger the touch recognition process.

To determine whether charge amounts in the charge accumulation regions corresponding to each key have reached stability, the charge balance amounts in the charge accumulation regions corresponding to each key may be recorded in advance, and a real-time comparison between amounts of accumulated charges and corresponding charge balance amounts in the charge accumulation regions may be performed during charge supplement.

Hereinafter, the above touch recognition method will be further described in conjunction with one embodiment of touch recognition.

Figure 4:
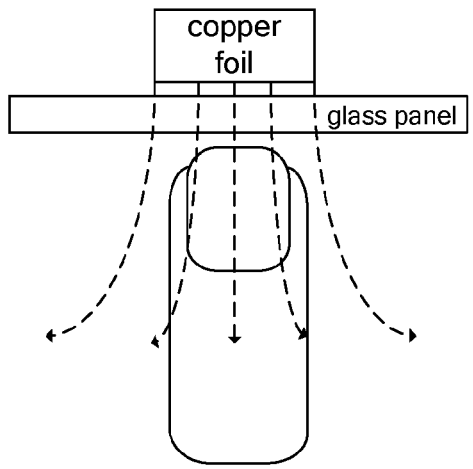
FIG. 4 schematically illustrates a touch recognition process by applying the touch key structure shown in FIG. 1 according to one embodiment of the present disclosure.

Referring to FIG. 4, in the touch key structure, the insulating touch panel is a glass panel and the electrodes are copper foils. When charging the copper foils by a power supply, the copper foils may generate a static electric field. The static electric field may penetrate the glass panel to polarize the glass panel and a polarizing electric field is generated. In FIG. 4, dotted lines denote the situation that the static electric field penetrates the glass panel.

When a key on the glass panel is being touched or almost being touched, the polarizing electric field corresponding to the key is influenced and the charge amount in a charge accumulation region of a copper foil corresponding to the key is changed significantly. To obtain the situation of the variation in charge amount, it is necessary to supplement charges to charge accumulation regions corresponding to each key on the glass panel. Specifically, the charge supplement process may include: connecting a plurality of standard unit capacitors with the copper foils respectively, charging and discharging the plurality of standard unit capacitors multiple times, and releasing charges to charge accumulation regions corresponding to the copper foils through the discharging of the plurality of standard unit capacitors. Namely, the charge supplement amount is the amount of charges released to the charge accumulation regions by the plurality of standard unit capacitors.

In some embodiments, to calculate the charge supplement amount more precisely in the duration of one touch action, it is better to divide the duration into a plurality of sub durations and record a charge supplement amount in each of the plurality of sub durations. The more the sub durations is, the precise the calculation is. However, it takes much time to charge and discharge a capacitor with large capacitance. Therefore, division of the duration is limited greatly. A better method is supplementing charges by employing a sample and hold circuit of an ADC in the conventional technologies.

Figure 5:
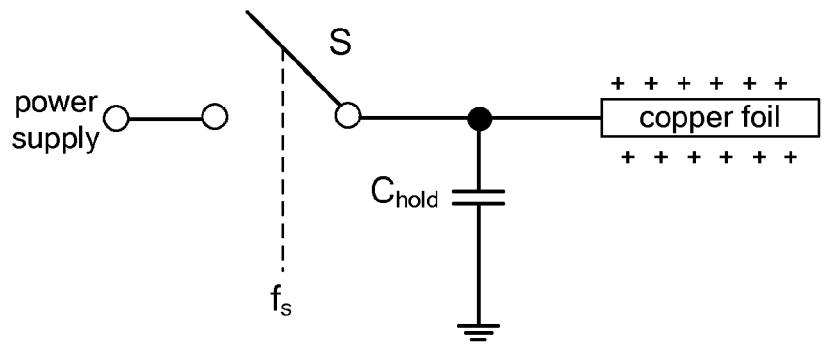
FIG. 5 schematically illustrates a process of charge supplement for charge accumulation regions through a hold capacitor in a sample and hold circuit of an Analog-to-Digital Converter (ADC) during the touch recognition process shown in FIG. 4 according to one embodiment of the present disclosure.

Referring to FIG. 5, the sample and hold circuit may include: an analog electronic switch S and a hold capacitor $C_{hold}$. The analog electronic switch S may be turned on/off repeatedly under the control of sampling pulses with a frequency of $f_s$. When the analog electronic switch S is turned on, a power supply charges the hold capacitor $C_{hold}$; otherwise, the hold capacitor $C_{hold}$ keeps its voltage unchanged.

In some embodiments, a copper foil is connected with a hold capacitor $C_{hold}$. When an analog electronic switch S is turned off, the hold capacitor $C_{hold}$ discharges charges to the copper foil and the copper foil is charged. Therefore, charges are accumulated in charge accumulation regions on a surface of the copper foil because of the charges released by the hold capacitor $C_{hold}$. Through controlling the frequency $f_s$ of sampling pulses, charging and discharging to the hold capacitor $C_{hold}$ can be performed rapidly, thereby charges are supplemented to the charge accumulation regions constantly. In a relatively short time, charge amounts in the charge accumulation regions may reach stability. In this manner, a whole charge supplement process may be divided into several charge supplement processes. In some embodiments, the hold capacitor $C_{hold}$ may have a capacitance of 0.5 pF.

Besides precise calculation of charge supplement amount, the charge supplement actions should be set reasonably.

Specifically, charge supplement can be performed to charge accumulation regions corresponding to each key in a touch key structure every fixed time. And after each charge supplement action, charge amounts in the charge accumulation regions should reach stability. During a charge supplement action, frequency of sampling pulses of the analog electric switch S may be set according to analysis of an actual touch situation and the accuracy of touch recognition. For example, sampling pulses used to control the charging and discharging of the hold capacitor may employ a same frequency or different frequencies at each charge supplement action. Preferably, different frequencies are employed.

In some embodiments, sampling pulses employing different frequencies at each charge supplement action may include: sampling pulses employing a larger frequency in a current charge supplement action than that in a former charge supplement action. A frequency range may be set to sampling pulses. The frequency of sampling pulses in a first charge supplement action may be set to be a lower limit of the frequency range; the frequency of sampling pulses in a second charge supplement action may be set to be a little larger than that in the first charge supplement action; and the frequency of sampling pulses in a third charge supplement action may be set to be a little larger than that in the second charge supplement action, and so on, until the frequency of sampling pulses in the latest charge supplement action reaches a relatively larger value or an upper limit in the range. In some embodiments, charge supplement action may be performed every fixed time, such as 5 µS. The frequency of sampling pulses may range from 80 kHz to 120 kHz.

In some embodiments, sampling pulses employing different frequencies at each charge supplement action may include: setting a frequency range to sampling pulses; sampling pulses employing a larger frequency in a current charge supplement action than that in a former charge supplement action; after the frequency of sampling pulses in some charge supplement action reaches an upper limit in the range, sampling pulses employing a smaller frequency in a current charge supplement action than that in a former charge supplement action. A frequency range may be set to sampling pulses. The frequency of sampling pulses in a first charge supplement action may be set to be a lower limit of the frequency range; the frequency of sampling pulses in second charge supplement action may be set to be a little larger than that in the first charge supplement action; and the frequency of sampling pulses in a third charge supplement action may be set to be a little larger than that in the second charge supplement action, and so on, until the frequency of sampling pulses in the latest charge supplement action reaches a relatively larger value or an upper limit in the range, then the frequency of sampling pulses in a current charge supplement action may be set to be smaller than that in a former charge supplement action. In some embodiments, charge supplement may be performed every fixed time, such as 5 µs. The frequency of sampling pulses may range from 80 kHZ to 120 kHZ.

To calculate charge variation in charge accumulation regions of copper foils corresponding to each key in the duration of one touch action accurately, it is necessary to comprehensively process a plurality of charge supplement amounts obtained by multiple charge supplement actions to obtain the charge variation.

Figure 6:
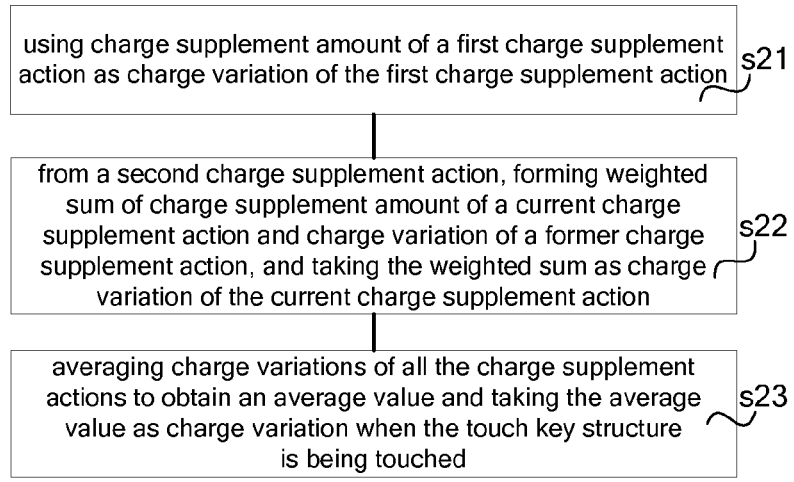
FIG. 6 schematically illustrates a flow chart of charge variation calculation during the touch recognition process shown in FIG. 4 according to one embodiment of the present disclosure.

Referring to FIG. 6, comprehensively process a plurality of charge supplement amounts may include steps of:

Step S21, using a charge supplement amount of a first charge supplement action as charge variation of the first charge supplement action;

Step S22, from a second charge supplement action, forming a weighted sum of charge supplement amount of a current charge supplement action and charge variation of a former charge supplement action, and taking the weighted sum as charge variation of the current charge supplement action; and Step S23, averaging charge variations of all the charge supplement actions to obtain an average value and taking the average value as charge variation of the touch key structure being touched.

The weighted sum is calculated based on the following formula: $C = C_1 \times N1 + C_2 \times N2$, where C is charge variation of the current charge supplement action, $C_1$ is charge variation of the former charge supplement action, $N_1$ is a weight of the former charge supplement action, $C_2$ is a charge supplement amount of the current charge supplement and $N_2$ is a weight of the current charge supplement action.

After calculating the charge variation in the charge accumulation regions of the copper foils corresponding to the keys, a ratio of charge variation in each charge accumulation region to a corresponding charge balance amount may be obtained. Afterwards, in the charge accumulation regions of the copper foils corresponding to the keys, the key corresponding to the charge accumulation region which has the largest charge variation and the largest ratio of the charge variation to the charge balance amount is determined as a touched key. In this manner, a touch recognition process is realized.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A touch recognition method, comprising:

when a touch key structure is being touched or almost being touched, supplementing charges to charge accumulation regions corresponding to each key in the touch key structure until charge amounts in the charge accumulation regions corresponding to each key reach stability;

calculating charge variation in each charge accumulation region when the touch key structure is being touched according to charge supplement amounts in the charge accumulation regions corresponding to each key and calculating the ratio of the charge variation to a charge balance amount in each charge accumulation region; and recognizing the key corresponding to the charge accumulation region which has the largest charge variation and the largest ratio of the charge variation to the charge balance amount as a touched key;

where the touch key structure comprises:
an insulating touch panel which has a plurality of keys; and
a detection plate which has a plurality of electrodes corresponding to each of the plurality of keys and is insulating and isolated from the insulating touch panel;

where after the plurality of electrodes are charged, a plurality of source electric fields are generated respectively and charge accumulation regions are formed on surfaces of the plurality of electrodes; each of the source fields penetrates a portion of the insulating touch panel corresponding to each of the plurality of keys to generate polarizing electric fields which spread out from a surface of each of the plurality of keys; and the charge accumulation regions corresponding to each of the plurality of electrodes are accumulated to be charged, wherein supplementing charges to charge accumulation regions corresponding to each key in the touch key structure comprises: charging and discharging a plurality of hold capacitors in a sample and hold circuit of an analog-to-digital converter, and releasing charges to charge accumulation regions corresponding to copper foils through the discharging of the plurality of hold capacitors every fixed time, where the charge supplement amount is the amount of charges released to the charge accumulation regions by the plurality of hold capacitors, sampling pulses are used to control charging and discharging the plurality of hold capacitors, and charges in each charge accumulation region reach stability after each charge supplement action, wherein sampling pulses employing a larger frequency in a current charge supplement action than that in a former charge supplement action.

2. The method according to claim 1, wherein the fixed time is 5 µs and the frequency of sampling pulses ranges from 80 kHz to 120 kHz.

3. A touch recognition method, comprising:

when a touch key structure is being touched or almost being touched, supplementing charges to charge accumulation regions corresponding to each key in the touch key structure until charge amounts in the charge accumulation regions corresponding to each key reach stability;

calculating charge variation in each charge accumulation region when the touch key structure is being touched according to charge supplement amounts in the charge accumulation regions corresponding to each key and calculating the ratio of the charge variation to a charge balance amount in each charge accumulation region; and recognizing the key corresponding to the charge accumulation region which has the largest charge variation and the largest ratio of the charge variation to the charge balance amount as a touched key;

where the touch key structure comprises:
an insulating touch panel which has a plurality of keys; and
a detection plate which has a plurality of electrodes corresponding to each of the plurality of keys and is insulating and isolated from the insulating touch panel;

where after the plurality of electrodes are charged, a plurality of source electric fields are generated respectively and charge accumulation regions are formed on surfaces of the plurality of electrodes; each of the source fields penetrates a portion of the insulating touch panel corresponding to each of the plurality of keys to generate polarizing electric fields which spread out from a surface of each of the plurality of keys; and the charge accumulation regions corresponding to each of the plurality of electrodes are accumulated to be charged, wherein supplementing charges to charge accumulation regions corresponding to each key in the touch key structure comprises: charging and discharging a plurality of hold capacitors in a sample and hold circuit of an analog-to-digital converter, and releasing charges to charge accumulation regions corresponding to copper foils through the discharging of the plurality of hold capacitors every fixed time, where the charge supplement amount is the amount of charges released to the charge accumulation regions by the plurality of hold capacitors, sampling pulses are used to control charging and discharging the plurality of hold capacitors with different frequencies at each charge supplement action, and charges in each charge accumulation region reach stability after each charge supplement action, wherein using sampling pulses with different frequencies at each charge supplement action comprises: setting a frequency range of the sampling pulses; except for a first charge supplement action, sampling pulses being applied in a current charge supplement action employing a larger frequency than that in a former charge supplement action; after the frequency of sampling pulses in some charge supplement action reaches an upper limit of the range, sampling pulses being applied in a current charge supplement action employing a smaller frequency than that in a former charge supplement action.

4. The method according to claim 3, wherein the fixed time is 5 μs and the frequency of sampling pulses ranges from 80 kHz to 120 kHz.

5. A touch recognition method, comprising:

when a touch key structure is being touched or almost being touched, supplementing charges to charge accumulation regions corresponding to each key in the touch key structure until charge amounts in the charge accumulation regions corresponding to each key reach stability;

calculating charge variation in each charge accumulation region when the touch key structure is being touched according to charge supplement amounts in the charge accumulation regions corresponding to each key and calculating the ratio of the charge variation to a charge balance amount in each charge accumulation region; and recognizing the key corresponding to the charge accumulation region which has the largest charge variation and the largest ratio of the charge variation to the charge balance amount as a touched key;

where the touch key structure comprises:

an insulating touch panel which has a plurality of keys; and a detection plate which has a plurality of electrodes corresponding to each of the plurality of keys and is insulating and isolated from the insulating touch panel;

where after the plurality of electrodes are charged, a plurality of source electric fields are generated respectively and charge accumulation regions are formed on surfaces of the plurality of electrodes; each of the source fields penetrates a portion of the insulating touch panel corresponding to each of the plurality of keys to generate polarizing electric fields which spread out from a surface of each of the plurality of keys; and the charge accumulation regions corresponding to each of the plurality of electrodes are accumulated to be charged, wherein supplementing charges to charge accumulation regions corresponding to each key in the touch key structure comprises: charging and discharging a plurality of standard unit capacitors, and releasing charges to charge accumulation regions corresponding to copper foils through the discharging of the plurality of standard unit capacitors every fixed time, where the charge supplement amount is the amount of charges released to the charge accumulation regions by the plurality of standard unit capacitors, and charges in each charge accumulation region reach stability after each charge supplement action, wherein calculating charge variation in each charge accumulation region when the touch key structure is being touched according to charge supplement amounts in the charge accumulation regions corresponding to each key comprises:

using a charge supplement amount of a first charge supplement action as charge variation of the first charge supplement;

from a second charge supplement action, forming a weighted sum of charge supplement amount of a current charge supplement action and charge variation of a former charge supplement action, and taking the weighted sum as charge variation of the current charge supplement action; and averaging charge variations of all the charge supplement actions to obtain an average value and taking the average value as charge variation of the touch key structure being touched.

6. The method according to claim 5, wherein the weighted sum is calculated based on the following formula: $C=C_1 \times N1 + C_2 \times N2$;

where C is charge variation of the current charge supplement action, $C_1$ is charge variation of the former charge supplement action, $N_1$ is a weight of the former charge supplement action, $C_2$ is a charge supplement amount of the current charge supplement action and $N_2$ is a weight of the current charge supplement action.

* * * * *